(12) United States Patent
Yang et al.

(10) Patent No.: US 10,340,469 B2
(45) Date of Patent: Jul. 2, 2019

(54) LIGHT EMITTING DIODE CHIP AND FABRICATION METHOD

(71) Applicant: XIAMEN SANAN OPTOELECTRONICS TECHNOLOGY CO., LTD., Xiamen (CN)

(72) Inventors: Shu-fan Yang, Xiamen (CN); Chun-Yi Wu, Xiamen (CN); Chaoyu Wu, Xiamen (CN); Duxiang Wang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/853,890

(22) Filed: Dec. 25, 2017

(65) Prior Publication Data

US 2018/0122982 A1  May 3, 2018

Related U.S. Application Data

(63) Continuation of application No. PCT/CN2016/097808, filed on Sep. 1, 2016.

(30) Foreign Application Priority Data

Dec. 4, 2015 (CN) .......................... 2015 1 0877969

(51) Int. Cl.
*H01L 21/66* (2006.01)
*H01L 27/15* (2006.01)
*H01L 51/44* (2006.01)
*H01L 31/0468* (2014.01)
*H01L 33/38* (2010.01)
*H01L 33/42* (2010.01)
*H01L 33/14* (2010.01)

(52) U.S. Cl.
CPC ........ *H01L 51/445* (2013.01); *H01L 31/0468* (2014.12); *H01L 33/382* (2013.01); *H01L 33/14* (2013.01); *H01L 33/42* (2013.01); *H01L 2933/0016* (2013.01)

(58) Field of Classification Search
CPC ...................................................... H01L 51/445
USPC ....................................... 257/86, 87; 438/30
See application file for complete search history.

(56) References Cited

U.S. PATENT DOCUMENTS 7,399,994 B2 * 7/2008 Muraki .................. H01L 33/42
  257/88
8,022,425 B2 * 9/2011 Yao ....................... H01L 33/382
  257/79

(Continued)

FOREIGN PATENT DOCUMENTS

CN  102800768 A  11/2012
CN  103107254 A  5/2013

*Primary Examiner* — Calvin Lee
(74) *Attorney, Agent, or Firm* — Syncoda LLC; Feng Ma

(57) ABSTRACT

A light-emitting diode chip includes an electrical connection layer is arranged over the light-emitting surface of the light-emitting epitaxial laminated layer, which is not connected with isolation of the dielectric layer. After CMP treatment, the flat surface is plated with a transparent current spreading layer, which reduces horizontal conduction resistance of the transparent current spreading layer and replaces the metal spreading finger for horizontal conduction.

19 Claims, 9 Drawing Sheets

(56) References Cited

U.S. PATENT DOCUMENTS 8,502,193 B2 * 8/2013 Song .................. H01L 33/0079
257/13
2012/0292634 A1 11/2012 Bae

* cited by examiner

LIGHT EMITTING DIODE CHIP AND FABRICATION METHOD

CROSS-REFERENCE TO RELATED APPLICATIONS

The present application is a continuation of, and claims priority to, PCT/CN2016/097808 filed on Sep. 1, 2016, which claims priority to Chinese Patent Application No. 201510877969.1 filed on Dec. 4, 2015. The disclosures of these applications are hereby incorporated by reference in their entirety.

BACKGROUND

In recent years, light-emitting diode (LED) is widely applied and plays an increasingly important role in various fields like display system, lighting system and automobile tail light.

FIG. 1 shows an existing AlGaInP-based LED chip structure, which increases luminance by changing the light-absorbing GaAs substrate into a Si substrate with a mirror system via bonding technology. However, the electrode needs to form ohmic contact with the epitaxial semiconductor and achieves current spreading through the electrode spreading finger, which shields light-emitting and reduces photoelectric efficiency. Later, it is proposed using ITO conduction to replace the metal spreading finger structure, the design of which, however, faces numerous restrictions due to limited number of semiconductor materials available for ohmic contact with ITO.

FIG. 2 shows another existing LED chip structure, in which, the surface spreading finger is replaced by an embedded metal channel structure. The current flows to the n-type semiconductor layer 3 from the top electrode 7, and is horizontally conducted through electron drift of semiconductor materials, to connect the active layer 1 and the p-type semiconductor layer 2. Next, a circuit is completed through conduction between the metal material 5 and the bottom electrode 6, wherein, a dielectric layer 4 isolates the active layer 1 and the metal material 5.

SUMMARY

The inventors of the present disclosure have recognized that, in the abovementioned LED chip structure, current is conducted with lowest resistance and in shortest path, resulting in unsatisfactory horizontal spreading effect of current. Current path R1 shows the farthest scope of horizontal spreading of the outer ring current, where conduction effect of the current path R2 has disappeared. Therefore, the actual light-emitting area is smaller than the entire light-emitting region, causing poorer conversion characteristic of photoelectric element than that of conventional structure.

To solve the above problems, some embodiments of the present disclosure provide a LED chip and fabrication method thereof, wherein, an electrical connection layer is arranged over the light-emitting surface of the light-emitting epitaxial laminated layer, which is disconnected or isolated by using dielectric material. After chemical mechanical polishing (CMP), the flat surface is plated with a transparent current spreading layer, which reduces horizontal conduction resistance of the transparent current spreading layer and replaces the metal spreading finger for horizontal conduction.

In one aspect of the present disclosure, a light-emitting diode chip is provided, which includes a light-emitting epitaxial laminated layer, further including a first-type semiconductor, a second-type semiconductor and an active layer between them. The light-emitting epitaxial laminated layer has two surfaces opposite to each other, wherein, a second surface is the light-emitting surface; a first electrical connection layer over a first surface of the light-emitting epitaxial laminated layer, which is composed of first geometric pattern arrays; a second electrical connection layer over the second surface of the light-emitting epitaxial laminated layer, which is composed of second geometric pattern arrays; a transparent current spreading layer over the surface of the second electrical connection layer; when external power is connected, the horizontal resistance of current passing through the transparent current spreading layer is less than that passing through the second electrical connection layer.

In some embodiments of the present disclosure, the LED chip also comprises a top electrode over the second electrical connection layer. When current is injected to the top electrode and conducted to the transparent current spreading layer, it is horizontally conducted in priority before injection to the second electrical connection layer.

In the aforesaid LED chip, the transparent current spreading layer is mainly for horizontal conduction and for connection to the second electrical connection layer, which is not directly conducted to the epitaxial layer structure. This overcomes the problem of most epitaxial quaternary material for unavailability for direct ohmic conduction to the transparent current spreading layer.

In some embodiments, average surface roughness of the second electrical connection layer Ra is 1 nm or below.

In some embodiments, the first geometric pattern array and the second geometric pattern array are alternatively arranged.

In some embodiments, the first geometric pattern array is not connected due to isolation by the first dielectric material, and the second geometric pattern array is not connected due to isolation by the second dielectric material.

In some embodiments, size of the first and second geometric pattern arrays is 5-10 μm.

In some embodiments, the second geometric pattern array area equals to or is less than $1/10$ of the light-emitting area of the light-emitting epitaxial laminated layer.

In some embodiments, the first dielectric material is composed of single-layer or multi-layer materials, which reflects radiation light source of the active layer and reduces optical loss.

In some embodiments, the second dielectric material is composed of anti-reflection single-layer or multi-layer materials, which increases radiation light source penetration of the active layer and reduces optical loss.

In some embodiments, the second electrical connection layer is AuGe, AuGeNi or TiAu alloy.

In some embodiments, the light-emitting epitaxial laminated layer is AlGaInP-based material.

In some embodiments, the transparent current spreading layer includes transparent conductive oxides like ITO and ZnO.

In a second aspect of the present disclosure, a fabrication method of a light-emitting diode is provided, which mainly include: 1) providing a light-emitting epitaxial laminated layer including a first-type semiconductor, a second-type semiconductor and an active layer between them, which has two surfaces opposite to each other, wherein, a first surface is the light-emitting surface; 2) fabricating a first electrical connection layer over the first surface of the light-emitting epitaxial laminated layer, which is composed of first geometric pattern arrays; 3) fabricating a second electrical connection layer over the second surface of the light-emitting epitaxial laminated layer, which is composed of second geometric pattern arrays; 4) fabricating a transparent current spreading layer over the surface of the second electrical connection layer; when external power is connected, the horizontal resistance of current passing through the transparent current spreading layer is less than that passing through the first electrical connection layer.

In some embodiments, the fabrication method also includes step 5): fabricating an electrode over the transparent current spreading layer. When current is injected to the first electrode and conducted to the transparent current spreading layer, it is horizontally conducted in priority before injection to the first electrical connection layer.

In some embodiments, step 3) is: evaporating a second electrical connection layer over the second surface of the light-emitting epitaxial laminated layer; evaporating a second dielectric material layer over the surface; etching the second electrical connection layer region to expose the second electrical connection layer; and flattening the surface of the second connection layer through CMP. Preferably, after CMP flattening, average surface roughness Ra can be reduced below 1 nm as scanned by the atomic force microscopy; and evaporating a transparent current spreading layer on the extremely-flat interface, which effectively increases conductivity and achieves horizontal conduction.

In a third aspect of the present disclosure, a light-emitting system comprising a plurality of light-emitting diodes is provided. Each light-emitting diode includes a light-emitting epitaxial laminated layer, further including a first-type semiconductor, a second-type semiconductor and an active layer between them. The light-emitting epitaxial laminated layer has two surfaces opposite to each other, wherein, a second surface is the light-emitting surface; a first electrical connection layer over a first surface of the light-emitting epitaxial laminated layer, which is composed of first geometric pattern arrays; a second electrical connection layer over the second surface of the light-emitting epitaxial laminated layer, which is composed of second geometric pattern arrays; a transparent current spreading layer over the surface of the second electrical connection layer; when external power is connected, the horizontal resistance of current passing through the transparent current spreading layer is less than that passing through the second electrical connection layer. The light-emitting system can be used in the fields of lighting, display, signage, etc.

Other features and advantages of various embodiments of the present disclosure will be described in detail in the following specification, and it is believed that such features and advantages will become more obvious in the specification or through implementations of this disclosure. The purposes and other advantages of the present disclosure can be realized and obtained in the structures specifically described in the specifications, claims and drawings.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, which are not drawn to scale.

DETAILED DESCRIPTION

Various embodiments described in detail below provide a LED chip, which includes a first electrical connection layer and a second electrical connection layer formed over surfaces at both sides of the light-emitting epitaxial laminated layer. With extremely small sizes, the first and second electrical connection layers are arranged over the entire plane in arrays. The two arrays are not overlapped but in alternating stacking layout when it is looked down from front. The light-emitting surface has no metal spreading electrode connection. Further, except the second electrical connection layer, the light-emitting surface of the light-emitting epitaxial laminated layer is entirely distributed with dielectric material optical films, wherein, the surface is flattened to extremely low roughness through CMP. After flattening, fabricate a transparent current spreading layer, wherein, the horizontal resistance of current passing through the transparent current spreading layer is less than that passing through the light-emitting epitaxial laminated layer. Therefore, through conduction of the transparent current spreading layer, each region of the second electrical connection layer is conducted; the bottom of the light-emitting epitaxial laminated layer is entirely distributed by dielectric layer optical film materials with high reflectivity. Therefore, the electrode obscuration ratio of the LED chip surface is extremely low, and the current steering conduction range is increased to enlarge chip light-emitting area so as to improve photoelectric conversion efficiency of the component.

Figure 1:
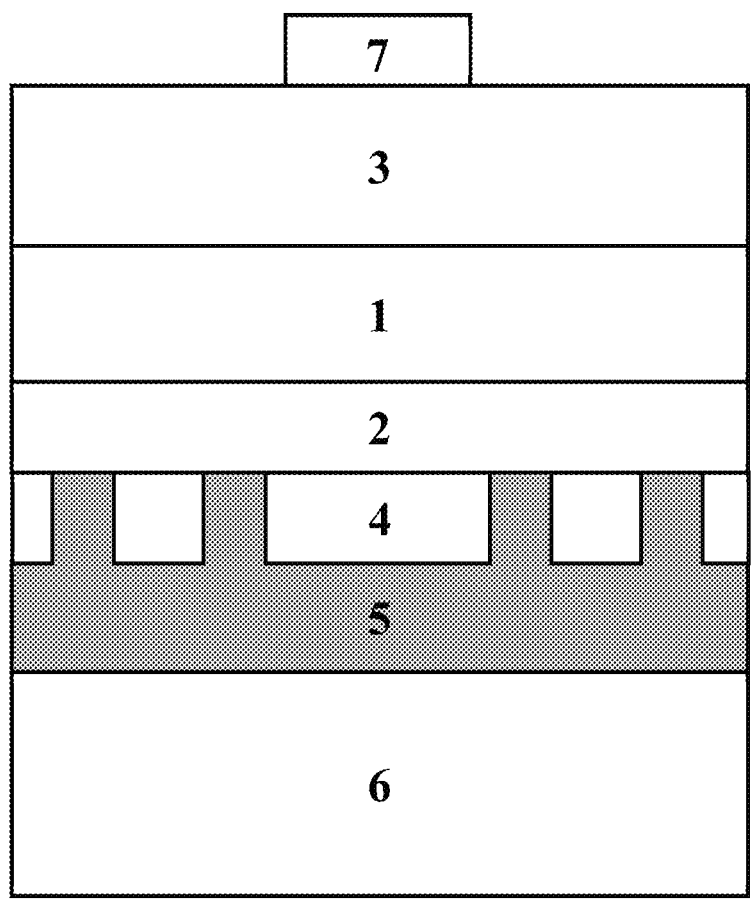
FIG. 1 illustrates a sectional view of an existing LED chip.
Figure 2:
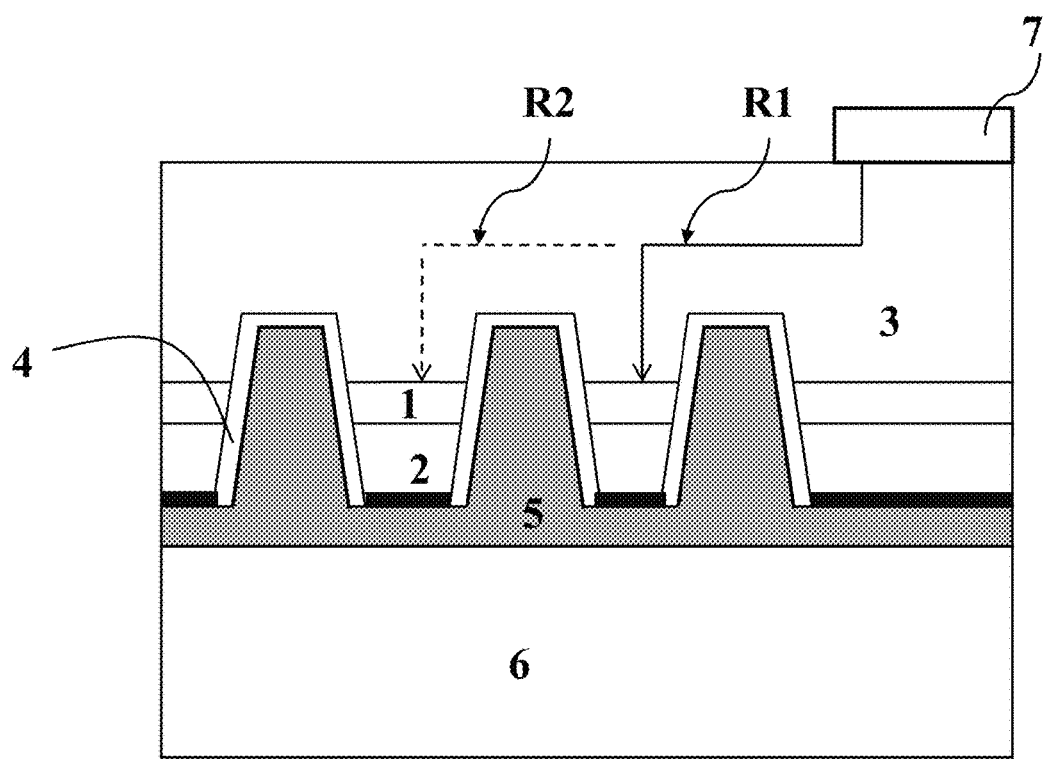
FIG. 2 illustrates a sectional view of another existing LED chip.
Figure 3:
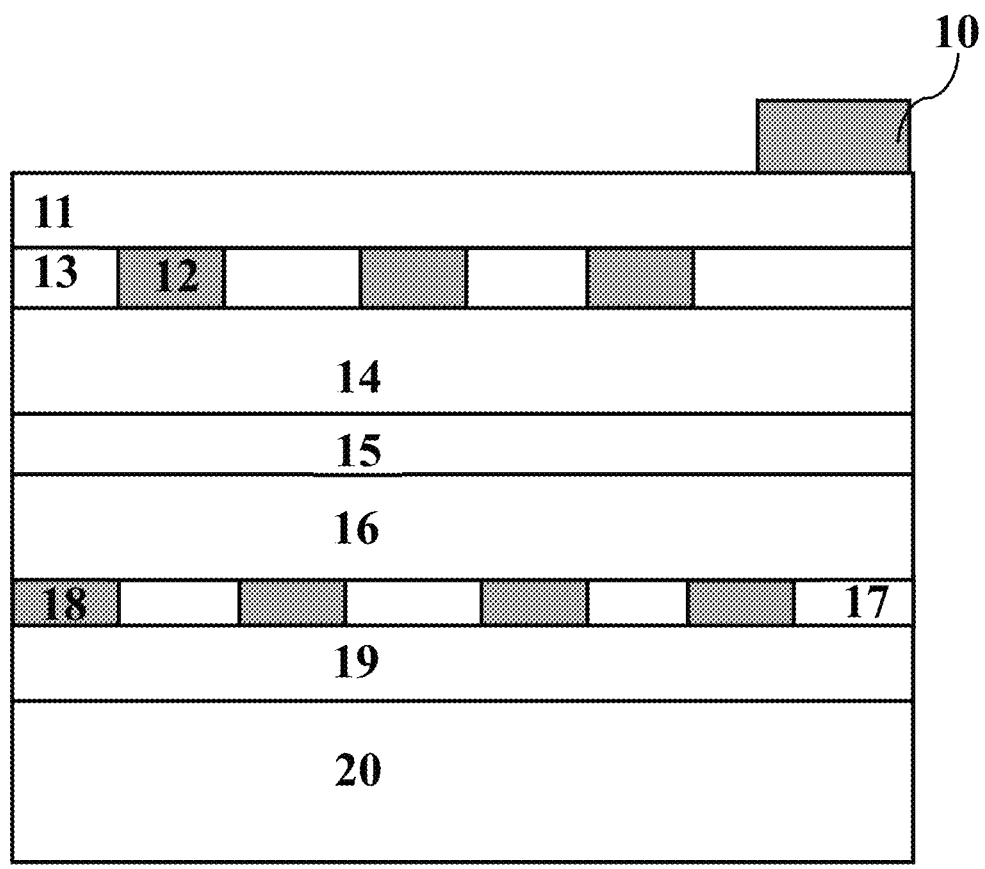
FIG. 3 illustrates a sectional view of a LED chip according to some embodiments of the present disclosure.

With reference to FIG. 3, a light-emitting diode chip according to the present disclosure, includes from up to bottom: a top electrode 10, a transparent current spreading layer 11, a second electrical connection layer 12, a second-type semiconductor layer 14, an active layer 15, a first-type semiconductor layer 16, a first electrical connection layer 18, a metal material layer 19, and a conductive substrate 20.

Figure 5:
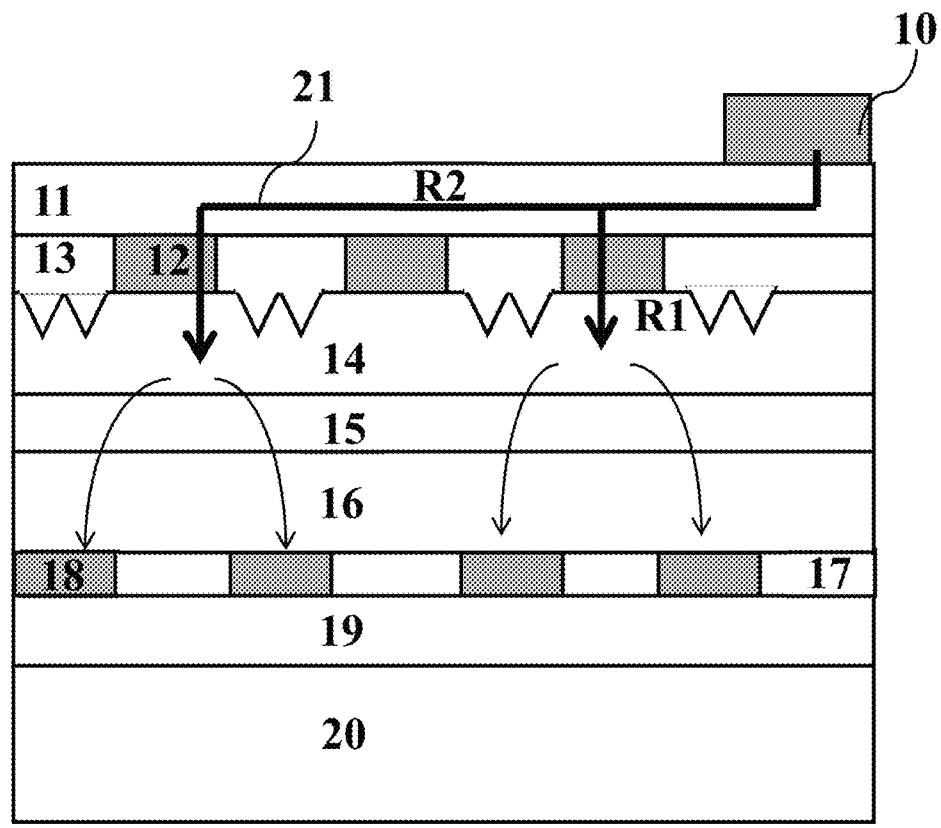
FIG. 5 illustrates a sectional view of another LED chip according to some embodiments of the present disclosure.

In some embodiments, the first-type semiconductor layer 16, the active layer 15 and the second-type semiconductor layer 14 constitute a light-emitting epitaxial laminated layer, wherein, one side surface of the second-type semiconductor layer 14 is the light-emitting surface. In this embodiment, AlGaInP-based materials are used, wherein, the first-type semiconductor layer 16 is p-type material, and the second-type semiconductor layer 14 is n-type material. In some embodiments, the light-emitting surface of the light-emitting epitaxial laminated layer is roughened, as shown in FIG. 5.

The first electrical connection layer 18 is metal material forming ohmic contact with the first-type semiconductor layer 16, which can be AuBe, AuZn, CrAu and other alloys; the second electrical connection layer 12 is metal material forming ohmic contact with the second-type semiconductor layer 14, which can be AuGe, AuGeNi, TiAu and other alloys.

Figure 4:
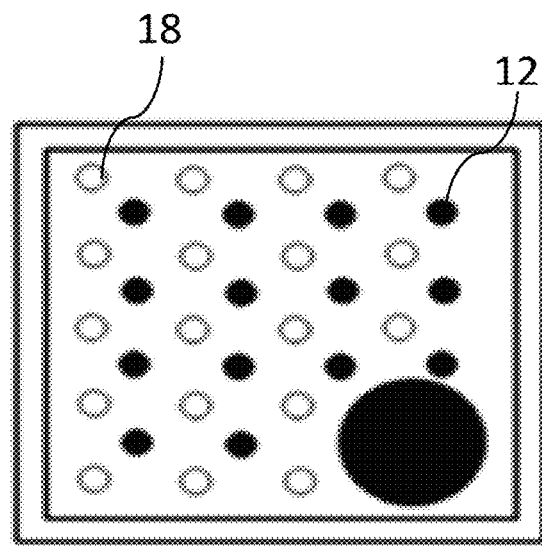
FIG. 4 shows a distribution diagram of a first electrical connection layer and a second electrical connection layer of the LED chip as shown in FIG. 3.

Referring to FIG. 4, the first electrical connection layer 18 and the second electrical connection layer 12 are circular or other geometric shapes. Each is distributed over the entire surface in array arrangement, and not overlapped when it is looked down from front. In some embodiments, the first and second electrical connection layers are 5-10 µm circular arrays, alternating in densest stacking, wherein, the area of the second geometric pattern array equals to or is less than 1/10 of the light-emitting area of the light-emitting epitaxial laminated layer, i.e., the electrode obscuration rate of the entire light-emitting region is <10%, lower than that of the metal electrode spreading finger.

In some embodiments, the first electrical connection layer 18 and the metal material layer 19 (the bottom electrode) are connected. In the array region, dielectric material 17 such as $SiO_2$ can be deposited. The dielectric materials can be a single layer or multi layers, and same or different, which is used for mirror reflection of the radiation light source of the active layer 15 to reduce optical loss and increase positive light-emitting. The second electrical connection layer 12 and the second-type semiconductor layer 14 are electrically connected. In the array region, dielectric material 13 like $SiN_x$ can be deposited. The dielectric materials 13 can be a single layer or multi layers, and same or different, which increases the radiation light source penetration of the active layer 15 and reduces optical loss thanks to antireflection effect. In some embodiments, in the second electrical connection layer, the surface dielectric material 13 is flattened through CMP. After treatment, average surface roughness Ra can be reduced below 1 nm as scanned by the atomic force microscopy (AFM). Fabricate a transparent current spreading layer on the extremely-flat interface, which effectively increases conductivity.

In some embodiments, the transparent current spreading layer 11 comprises transparent conductive oxides like ITO and ZnO. In this chip structure, it is mainly used for horizontal conduction. When roughness is reduced after CMP, the cross-section resistance can be reduced for horizontal conduction. After current is conducted to the transparent current spreading layer 11 from the top electrode 10, the current horizontal conduction resistance of the transparent current spreading layer 11 is extremely low. If this resistance is lower than the resistance that directly conducts to the light-emitting epitaxial laminated layer, current will select horizontal conduction as priority so that current can be smoothly conducted to the electrical connection layer at the outer ring to the chip light-emitting region, and then completely and uniformly spread over the entire light-emitting layer for coupling emission with the active layer.

FIG. 5 illustrates the current path diagram of the aforesaid structure. When the top electrode 10 is energized, a part of current is conducted to the first electrical connection layer through R1. When R1 current density is increased and conduction resistance is higher than that of the R2 conduction path, current will select R2 path with low resistance for horizontal conduction and spread to the second electrical connection layer 12 of the entire light-emitting region, which overcomes poor horizontal spreading of the prior art. As the second electrical connection layer 12 and the first electrical connection layer 18 are of alternating distribution, when current flows to the second connection layer 14, current continues horizontal conduction and flows through the active layer 15 and the first electrical connection layer 18, and is conducted to the bottom electrode 19. As a result, the light-emitting region of the active layer 15 emits light upwards, which avoids electrode obscuration. In addition, current is spread and distributed evenly to achieve better light-emitting effect and photoelectric characteristics.

Figure 6:
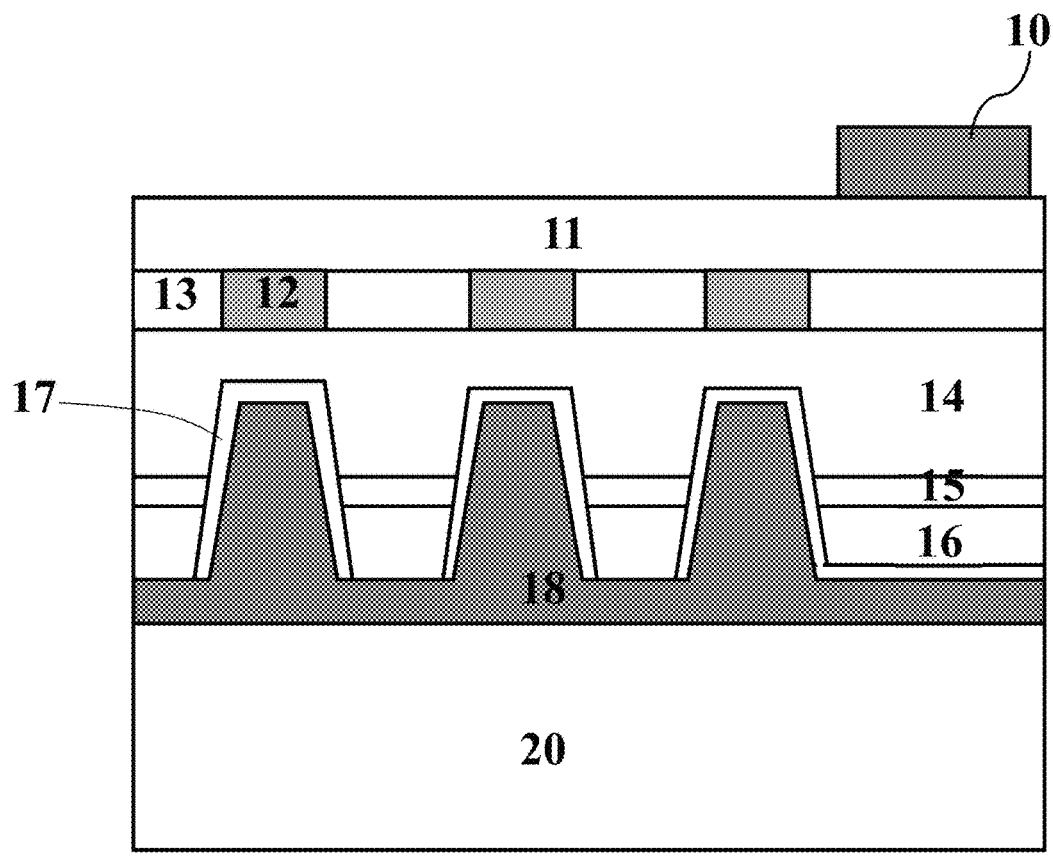
FIG. 6 illustrates a sectional view of another LED chip according to some embodiments of the present disclosure.

FIG. 6 illustrates another LED chip of the present disclosure, and the difference from the LED chip shown in FIG. 3 is that: the first electrical connection layer 18 has an embedded electrode, a part of which passes through the first-type semiconductor layer 16, the active layer 15 till the second-type semiconductor layer 14, and is insulated from the active layer 15 and the second-type semiconductor layer 14 through the dielectric material 17. In this structure, the contact regions of the first electrical connection layer 18 and the first-type semiconductor layer 16 are also arranged in geometric pattern array and are in alternating distribution with the second electrical connection layer 12.

FIGS. 7-14 illustrate the fabrication method of a LED chip as shown in FIG. 5. Brief description is given below in combination with accompanying drawings.

Figure 7:
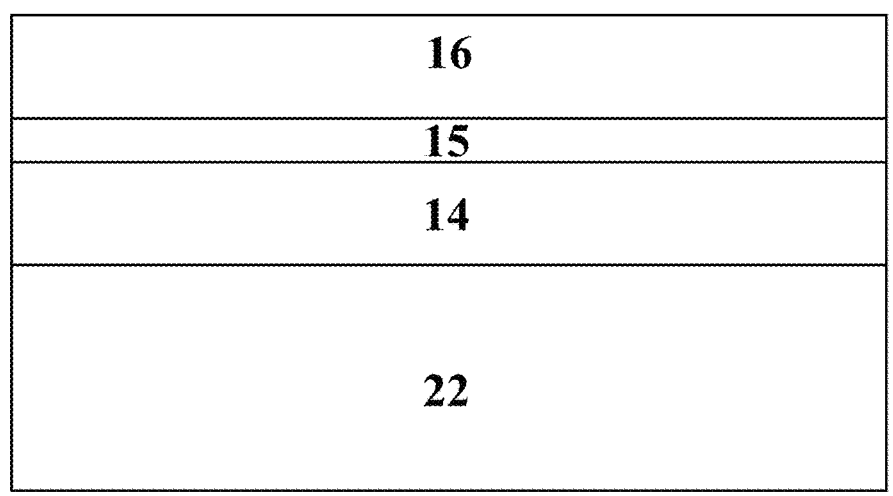
FIG. 7 illustrates a sectional view of a step in the fabrication process of the LED as shown in FIG. 5, which includes grow a second-type semiconductor layer, an active layer and a first-type semiconductor layer over the substrate of gallium arsenide or other substrates suitable for growing quaternary material.

First, grow a second-type semiconductor layer 14, an active layer 15 and a first-type semiconductor layer 16 over the substrate 22 of gallium arsenide or other substrates suitable for growing quaternary material, as shown in FIG. 7.

Figure 8:
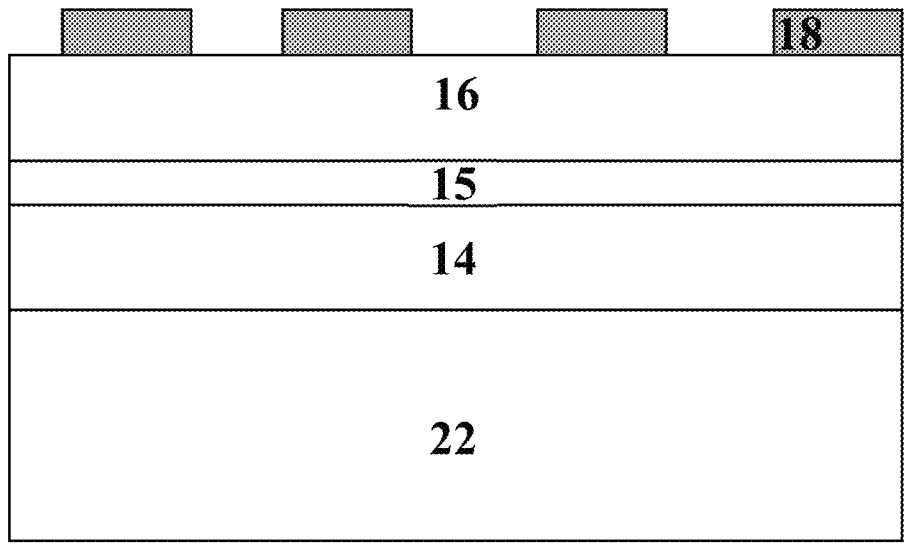
FIG. 8 illustrates a sectional view of a step in the fabrication process of the LED as shown in FIG. 5, which includes form a first electrical connection layer over the surface of the first-type semiconductor layer, and define the pattern.

Second, form a first electrical connection layer 18 over the surface of the first-type semiconductor layer 16, and define the pattern, as shown in FIG. 8.

Figure 9:
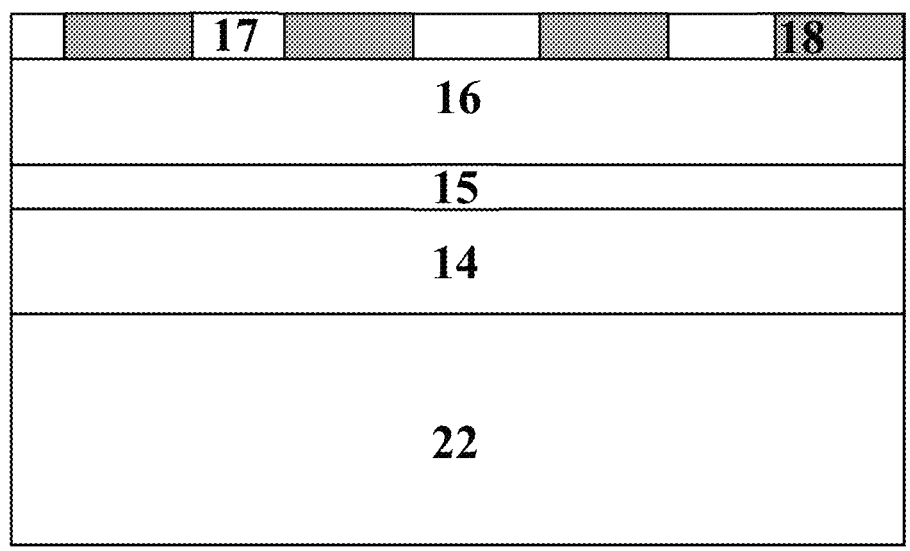
FIG. 9 illustrates a sectional view of a step in the fabrication process of the LED as shown in FIG. 5, which includes deposit the dielectric material, and remove the dielectric material over the surface of the first electrical connection layer.

Third, deposit the dielectric material 17, and remove the dielectric material over the surface of the first electrical connection layer 18, the structure of which is as shown in FIG. 9.

Figure 10:
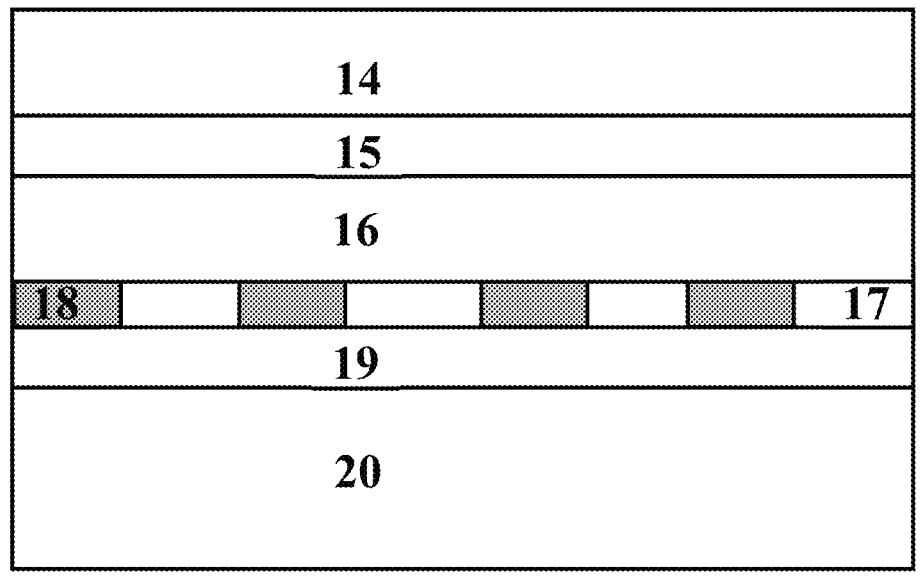
FIG. 10 illustrates a sectional view of a step in the fabrication process of the LED as shown in FIG. 5, which includes form a bonding metal over the surface of the first electrical connection layer, and bond it with the conductive substrate. After bonding, remove the substrate.

Fourth, form a bonding metal 19 over the surface of the first electrical connection layer 18, and bond it with the conductive substrate 20. After bonding, remove the substrate 22, the structure of which is as shown in FIG. 10.

Figure 11:
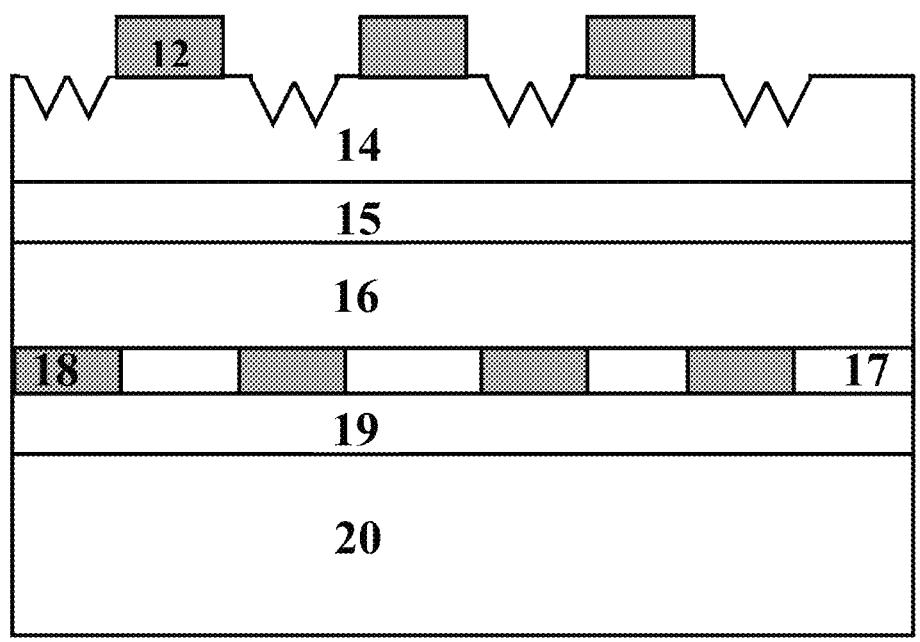
FIG. 11 illustrates a sectional view of a step in the fabrication process of the LED as shown in FIG. 5, which includes evaporate a second electrical connection layer over the surface of the second-type semiconductor layer, and roughen the light-emitting region of the second-type semiconductor layer.

Fifth, evaporate a second electrical connection layer 12 over the surface of the second-type semiconductor layer 14, and roughen the light-emitting region of the second-type semiconductor layer 14, the structure of which is as shown in FIG. 11.

Figure 12:
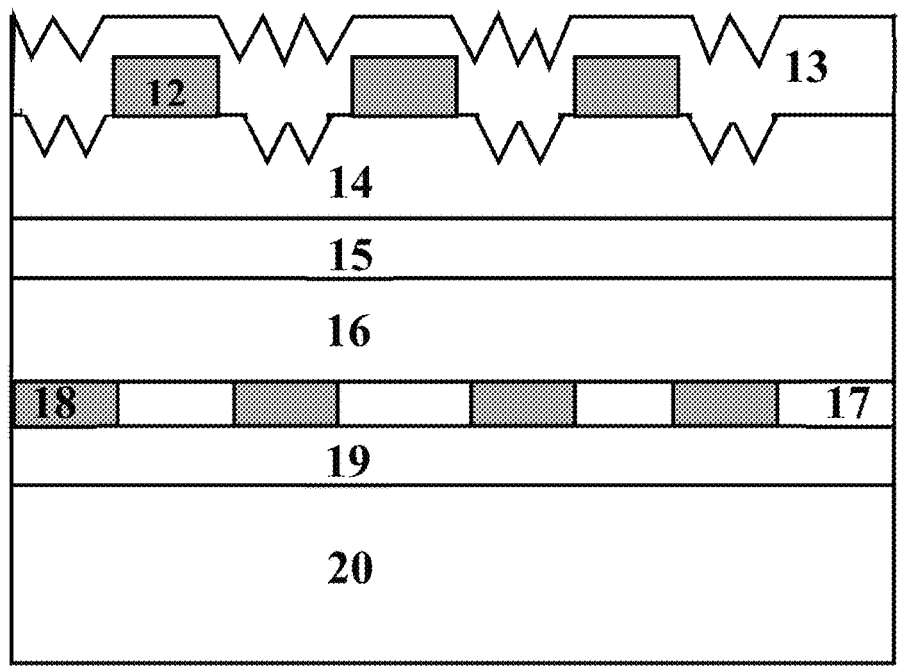
FIG. 12 illustrates a sectional view of a step in the fabrication process of the LED as shown in FIG. 5, which includes fabricate a dielectric material over the surface of the second electrical connection layer.
Figure 13:
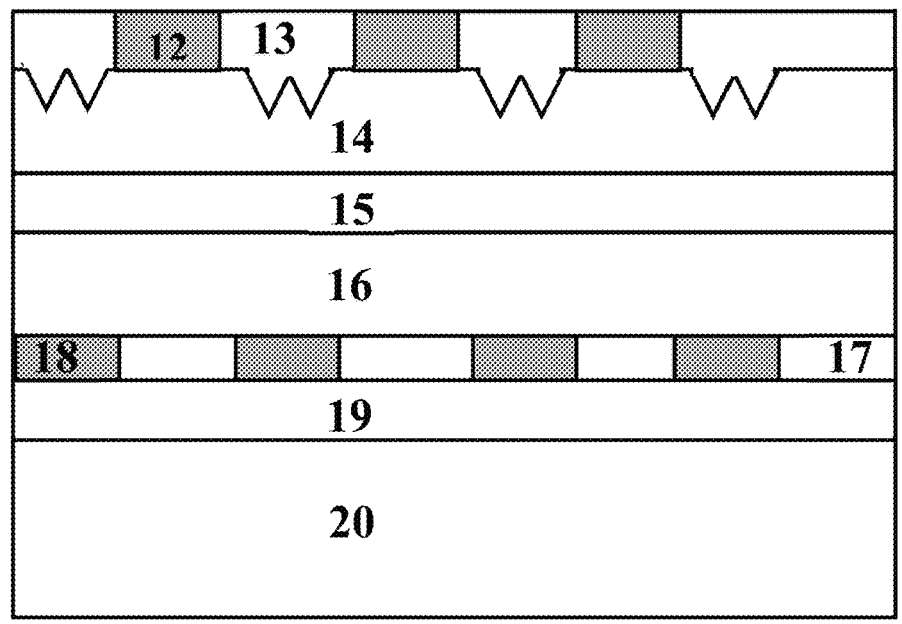
FIG. 13 illustrates a sectional view of a step in the fabrication process of the LED as shown in FIG. 5, which includes etch the region of the second electrical connection layer to expose the second electrical connection layer. Flatten the rough surface through CMP.

Sixth, fabricate a dielectric material 13 over the surface of the second electrical connection layer 12, and etch the region of the second electrical connection layer 12 to expose the second electrical connection layer 12. Flatten the rough surface through CMP, the process of which is as shown in FIGS. 12 and 13.

Figure 14:
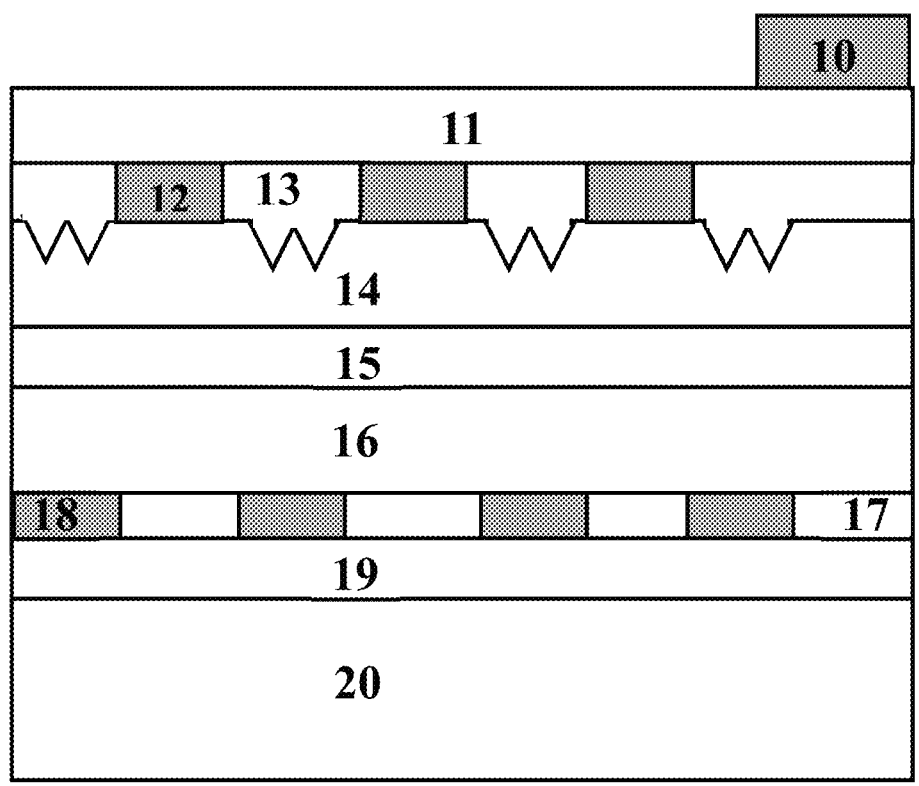
FIG. 14 illustrates a sectional view of a step in the fabrication process of the LED as shown in FIG. 5, which includes form a transparent current spreading layer over the surface of the second electrical connection layer, and fabricate the top electrode.

Seven, after CMP treatment, form a transparent current spreading layer 11 over the surface of the second electrical connection layer 12, and fabricate the top electrode 10, as shown in FIG. 14.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A fabrication method of a light-emitting diode chip, comprising:
   1) providing a light-emitting epitaxial laminated layer, comprising a first-type semiconductor layer, a second-type semiconductor layer and an active layer between them, which has two surfaces opposite to each other, wherein, the second surface is the light-emitting surface;
   2) fabricating a first electrical connection layer over the first surface of the light-emitting epitaxial laminated layer, which is composed of first geometric pattern arrays;
   3) fabricating a second electrical connection layer over the second surface of the light-emitting epitaxial laminated layer, which is composed of second geometric pattern arrays;
   4) fabricating a transparent current spreading layer over the surface of the second electrical connection layer; when external power is connected, the horizontal resistance of current passing through the transparent current spreading layer is less than that passing through the first electrical connection layer;
   wherein step 3) comprises evaporating a second electrical connection layer over the second surface of the light-emitting epitaxial laminated layer; evaporating a second dielectric material layer over the surface; etching the second electrical connection layer region to expose the second electrical connection layer; and flattening the surface of the second connection layer through chemical mechanical polishing.

2. The fabrication method of claim 1, further comprising step 5):
   fabricating a first electrode over the transparent current spreading layer, in which, when current is injected to the first electrode and conducted to the transparent current spreading layer, it is horizontally conducted in priority before injection to the first electrical connection layer.

3. A light-emitting diode chip, comprising:
   a light-emitting epitaxial laminated layer including a first-type semiconductor layer, a second-type semiconductor layer and an active layer between them, which has two surfaces opposite to each other, wherein, the second surface is the light-emitting surface;
   a first electrical connection layer over the first surface of the light-emitting epitaxial laminated layer, which is composed of first geometric pattern arrays;
   a second electrical connection layer over the second surface of the light-emitting epitaxial laminated layer, which is composed of second geometric pattern arrays; and
   a transparent current spreading layer over the surface of the second electrical connection layer;
   wherein, when external power is connected, the horizontal resistance of current passing through the transparent current spreading layer is less than that passing through the second electrical connection layer;
   wherein the light-emitting diode chip is fabricated with a method comprising:
   1) providing the light-emitting epitaxial laminated layer, comprising the first-type semiconductor layer, the second-type semiconductor layer and the active layer between them, which has two surfaces opposite to each other, wherein, the second surface is the light-emitting surface;
   2) fabricating the first electrical connection layer over the first surface of the light-emitting epitaxial laminated layer, which is composed of the first geometric pattern arrays;
   3) fabricating the second electrical connection layer over the second surface of the light-emitting epitaxial laminated layer, which is composed of the second geometric pattern arrays;
   4) fabricating the transparent current spreading layer over the surface of the second electrical connection layer; when the external power is connected, the horizontal resistance of current passing through the transparent current spreading layer is less than that passing through the first electrical connection layer;
   wherein step 3) comprises evaporating the second electrical connection layer over the second surface of the light-emitting epitaxial laminated layer; evaporating the second dielectric material layer over the surface; etching the second electrical connection layer region to expose the second electrical connection layer; and flattening the surface of the second connection layer through chemical mechanical polishing.

4. The light-emitting diode chip of claim 3, wherein the light-emitting epitaxial laminated layer comprises an AlGaInP-based material.

5. The light-emitting diode chip of claim 3, further comprising a top electrode over the second electrical connection layer, in which, when current is injected to the top electrode and conducted to the transparent current spreading layer, it is horizontally conducted in priority before injection to the second electrical connection layer.

6. The light-emitting diode chip of claim 5, wherein the first geometric pattern array and the second geometric pattern array are alternatively arranged.

7. The light-emitting diode chip of claim 5, wherein average surface roughness of the second electrical connection layer Ra is 1 nm or below.

8. The light-emitting diode chip of claim 5, wherein the second electrical connection layer is AuGe, AuGeNi, or TiAu alloy.

9. The light-emitting diode chip of claim 5, wherein the first geometric pattern array is not connected due to isolation by the first dielectric material, and the second geometric pattern array is not connected due to isolation by the second dielectric material.

10. The light-emitting diode chip of claim 9, wherein the second dielectric material is composed of anti-reflection single-layer or multi-layer materials, which increases radiation light source penetration of the active layer and reduces optical loss.

11. The light-emitting diode chip of claim 9, wherein the first dielectric material is composed of single-layer or multi-layer materials, which reflects radiation light source of the active layer and reduces optical loss.

12. The light-emitting diode chip of claim 9, wherein the second geometric pattern array area equals to or is less than $1/10$ of the light-emitting area of the light-emitting epitaxial laminated layer.

13. A light-emitting system comprising a plurality of light-emitting diodes, each light-emitting diode including:
    a light-emitting epitaxial laminated layer comprising a first-type semiconductor layer, a second-type semiconductor layer and an active layer between them, which has two surfaces opposite to each other, wherein, the second surface is the light-emitting surface;
    a first electrical connection layer over the first surface of the light-emitting epitaxial laminated layer, which is composed of first geometric pattern arrays;
    a second electrical connection layer over the second surface of the light-emitting epitaxial laminated layer, which is composed of second geometric pattern arrays; and
    a transparent current spreading layer over the surface of the second electrical connection layer;
    wherein, when external power is connected, the horizontal resistance of current passing through the transparent current spreading layer is less than that passing through the second electrical connection layer;
    wherein the each light-emitting diode is fabricated with a method comprising:
    1) providing the light-emitting epitaxial laminated layer, comprising the first-type semiconductor layer, the second-type semiconductor layer and the active layer between them, which has two surfaces opposite to each other, wherein, the second surface is the light-emitting surface;
    2) fabricating the first electrical connection layer over the first surface of the light-emitting epitaxial laminated layer, which is composed of the first geometric pattern arrays;
    3) fabricating the second electrical connection layer over the second surface of the light-emitting epitaxial laminated layer, which is composed of the second geometric pattern arrays;
    4) fabricating the transparent current spreading layer over the surface of the second electrical connection layer; when the external power is connected, the horizontal resistance of current passing through the transparent current spreading layer is less than that passing through the first electrical connection layer;
    wherein step 3) comprises evaporating the second electrical connection layer over the second surface of the light-emitting epitaxial laminated layer; evaporating the second dielectric material layer over the surface; etching the second electrical connection layer region to expose the second electrical connection layer; and flattening the surface of the second connection layer through chemical mechanical polishing.

14. The light-emitting system of claim 13, wherein each light-emitting diode further comprises a top electrode over the second electrical connection layer, in which, when current is injected to the top electrode and conducted to the transparent current spreading layer, it is horizontally conducted in priority before injection to the second electrical connection layer.

15. The light-emitting system of claim 14, wherein the first geometric pattern array and the second geometric pattern array are alternatively arranged.

16. The light-emitting system of claim 14, wherein average surface roughness of the second electrical connection layer Ra is 1 nm or below.

17. The light-emitting system of claim 14, wherein the first geometric pattern array is not connected due to isolation by the first dielectric material, and the second geometric pattern array is not connected due to isolation by the second dielectric material.

18. The light-emitting system of claim 17, wherein the first dielectric material is composed of single-layer or multi-layer materials, which reflects radiation light source of the active layer and reduces optical loss.

19. The light-emitting system of claim 17, wherein the second geometric pattern array area equals to or is less than $1/10$ of the light-emitting area of the light-emitting epitaxial laminated layer.

* * * * *